US008738352B2

United States Patent
Chaumont et al.

(10) Patent No.: US 8,738,352 B2
(45) Date of Patent: *May 27, 2014

(54) MANAGING COMMUNICATION BANDWIDTH IN CO-VERIFICATION OF CIRCUIT DESIGNS

(75) Inventors: Nicolas Chaumont, Villebon sur Yvette (FR); Jean-Marc Brault, Guyancourt (FR)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/281,790

(22) Filed: Oct. 26, 2011

(65) Prior Publication Data

US 2012/0136645 A1    May 31, 2012

Related U.S. Application Data

(63) Continuation of application No. 11/176,002, filed on Jul. 6, 2005, now Pat. No. 8,073,672.

(60) Provisional application No. 60/651,456, filed on Jul. 6, 2004.

(51) Int. Cl.
*G06F 9/455*    (2006.01)

(52) U.S. Cl.
USPC .............................................. 703/23; 703/17

(58) Field of Classification Search
CPC ........................................................ G06F 9/455
USPC .................................................... 703/23, 17
See application file for complete search history.

(56) References Cited

U.S. PATENT DOCUMENTS

| | | | |
|---|---|---|---|
| 6,009,259 A | 12/1999 | Ikeda et al. | |
| 6,138,266 A | 10/2000 | Ganesan et al. | |
| 7,366,652 B2 | 4/2008 | Wang et al. | |
| 7,640,155 B2 | 12/2009 | Poplack et al. | |
| 7,721,036 B2 * | 5/2010 | Poplack et al. | 710/305 |
| 7,739,097 B2 * | 6/2010 | Sample et al. | 703/19 |
| 2004/0078184 A1 | 4/2004 | Inomoto et al. | |
| 2004/0243384 A1 | 12/2004 | Chen et al. | |
| 2005/0081170 A1 | 4/2005 | Hyduke et al. | |

OTHER PUBLICATIONS

Andrew S. Tanenbaum, Structured Computer Organization, 2nd ed.: 1984; ISBN 0138544239; pp. 10-12.

* cited by examiner

*Primary Examiner* — Kandasamy Thangavelu
*Assistant Examiner* — Juan Ochoa
(74) *Attorney, Agent, or Firm* — Banner & Witcoff, Ltd

(57) ABSTRACT

Related communication signals between a simulator and an emulator are organized into logical channels. The signals in each channel are then be transmitted only as needed, reducing the use of the communication pathways between the simulator and the emulator. Further, the circuit components that will receive the communication signals to be shared on a channel are be physically located close together within the emulator, thereby reducing the time required to select and enable components of the emulator to receive the signals sent by the simulator. Similarly, emulator components that send communication signals to be shared on a channel are physically located close together within the emulator, thereby reducing the time required to select and enable components of the emulator to send these signals to the simulator.

20 Claims, 10 Drawing Sheets

| SIGNAL | DELAY EVENT/TIME |
|---|---|
| DATA [31:0] | 2↑ SYSCLOCK |
| QTZ | 40 NS |
| ADDR[63:0] | SYSCLOCK |
| POL | 4↑ BLOCK |

MANAGING COMMUNICATION BANDWIDTH IN CO-VERIFICATION OF CIRCUIT DESIGNS

CROSS REFERENCE TO RELATED APPLICATIONS

The present application is a CONTINUATION of and claims priority to application Ser. No. 11/176,002, filed Jul. 6, 2005 U.S. Pat. No. 8,073,672, issued Dec. 6, 2011, having the same title, which is a CONTINUATION-IN-PART of U.S. provisional application Ser. No. 60/651,456, filed Jul. 6, 2004, entitled "Managing Communication Bandwidth In Co-Verification Of Circuit Designs." The above identified applications are incorporated by reference in their entirety.

FIELD

The present invention relates to the management of communication bandwidth in the co-verification of circuit designs, such as integrated circuit designs. Various aspects of the invention more particularly relate to the use of different communication protocols for different groups of communication signals during the co-verification of an integrated circuit design.

BACKGROUND

Some modern electronic circuit designs, such as the designs of electronic circuits integrated onto a metal substrate (often referred to as "integrated circuits" or "IC chips"), have become extremely complex. As a result, various techniques have been developed to verify that circuit designs will operate as desired before they are implemented in an expensive manufacturing process. For example, some circuit designers now employ software instructions to simulate the operation of a circuit design using a computing device. Such circuit simulation software programs or "simulators" can be used to verify the functional and/or timing characteristics of a circuit design.

In some instances, however, software that simulates a large circuit may operate many orders of magnitude slower than the actual circuit would operate. In an effort to verify circuit designs more quickly, some verification techniques emulate portions of an electronic circuit design using actual electronic circuit components. That is, one or more portions of a circuit design are emulated with an emulation circuit or "emulator." The emulator typically is made up of electronic components that can be more easily configured into the designed circuit than actually manufacturing the designed circuit itself. For example, some verification techniques may verify a circuit design using an emulator formed of one or more field programmable gate arrays (FPGA) or similar types of programmable devices. Some vendors even have developed specialized devices specifically to emulate circuit designs.

For many situations, a circuit designer or tester may use both a hardware emulator and a software simulator to verify a circuit design. For example, a circuit designer may use one or more emulators to emulate the most complex components in a design, and then use one or more simulators to verify the other components of the design. In such an environment, the simulators and the emulators may need to communicate with each other, in order to reproduce the communication that would actually take place between the various components of the circuit being verified.

With some circuit designs, the number of data and control signals that need to be communicated between the portion of the circuit being emulated in hardware and the portion of the circuit being simulated in software may be substantial. Because the emulator may only have a fixed number of physical contacts (e.g., contact pins) with the simulator, however, the number of communication pathways for these signals may be limited. Thus, it is desirable to reduce the communication overhead between the emulator and the simulator by allowing data signals to be more transferred at a faster rate over these communication pathways. More particularly, it is desirable to allow data exchanged between a simulator and an emulator to be more quickly processed, to thereby speed up the test of a circuit design.

BRIEF SUMMARY

Advantageously, various embodiments of the invention help to increase the rate at which communications between a simulator and an emulator can be processed. More particularly, related communication signals between the simulator and the emulator are organized into logical channels. The signals in each channel then can be transmitted only as needed, reducing the use of the communication pathways. Further, the circuit components that will receive the communication signals to be shared on a channel can be physically located close together within the emulator, thereby reducing the time required to select and enable components of the emulator to receive the signals sent by the simulator. Similarly, emulator components that send communication signals to be shared on a channel can be physically located close together within the emulator, thereby reducing the time required to select and enable components of the emulator to send these signals to the simulator.

The related communication signals organized into an individual channel may be grouped according to any desired parameter or parameters. For example, with some embodiments of the invention, one or more of the communication signals exchanged between the simulator and the emulator may be data signals that change at the same time. These data signals then may be collected together into a single logical channel, and this single channel of data can be between the simulator and the emulator only when they change. When the values of these grouped signals remain constant, these signals are not sent to the emulator, freeing up the communication pathways between the emulator and the simulator to be used for exchanging other signals.

With still other embodiments of the invention, signals may alternately or additionally be organized into a single logical channel based upon different or additional parameters. For example, signals that change only on a specific clock cycle may be considered related and grouped into a single logical channel. These signals can then be transmitted only when that clock cycle occurs. Alternately or additionally, signals intended for a specific portion of the emulator, such as an emulated memory device, may be collected into a single logical channel. The signals in this channel may then be transmitted only when the associated portion of the emulator should receive the signals. Still further, signals that originate from a specific portion of the emulator may be collected into a single logical channel. For example, one or more of the signals from an emulated memory device may be grouped together and transmitted over the same logical channel.

Still further, signals intended to perform a common operation can grouped into a signal channel. For example, a "WRITE" operation to write data to a device may employ one or more data signals and one or more command signals (such as a "WRITE" command signal) to complete the "WRITE" operations. These data and command signals may then be collected into a single logical channel that is transmitted only when both the values of the data signals change and the values of the command signals would allow the "WRITE" operation to be executed. Of course, still other parameters for organizing communication signals into logical channels will be apparent to those of ordinary skill in the art based upon the foregoing and following description.

Once the signals to be included in a channel have been selected, then the components responsible for producing those communication signals can be located proximal to each other within the emulator. More particularly, once the communication signals to be included in a channel have been selected, the circuit components that will send or receive those signals are identified. During the compilation of the circuit design in the emulator, the emulation circuits emulating those components are physically located close to each other. This reduces the selection time required to select each emulated component sending or receiving a signal carried over the channel, thereby increasing the rate at which data can be transferred over the channel.

DETAILED DESCRIPTION

Operating Environment

Figure 1:
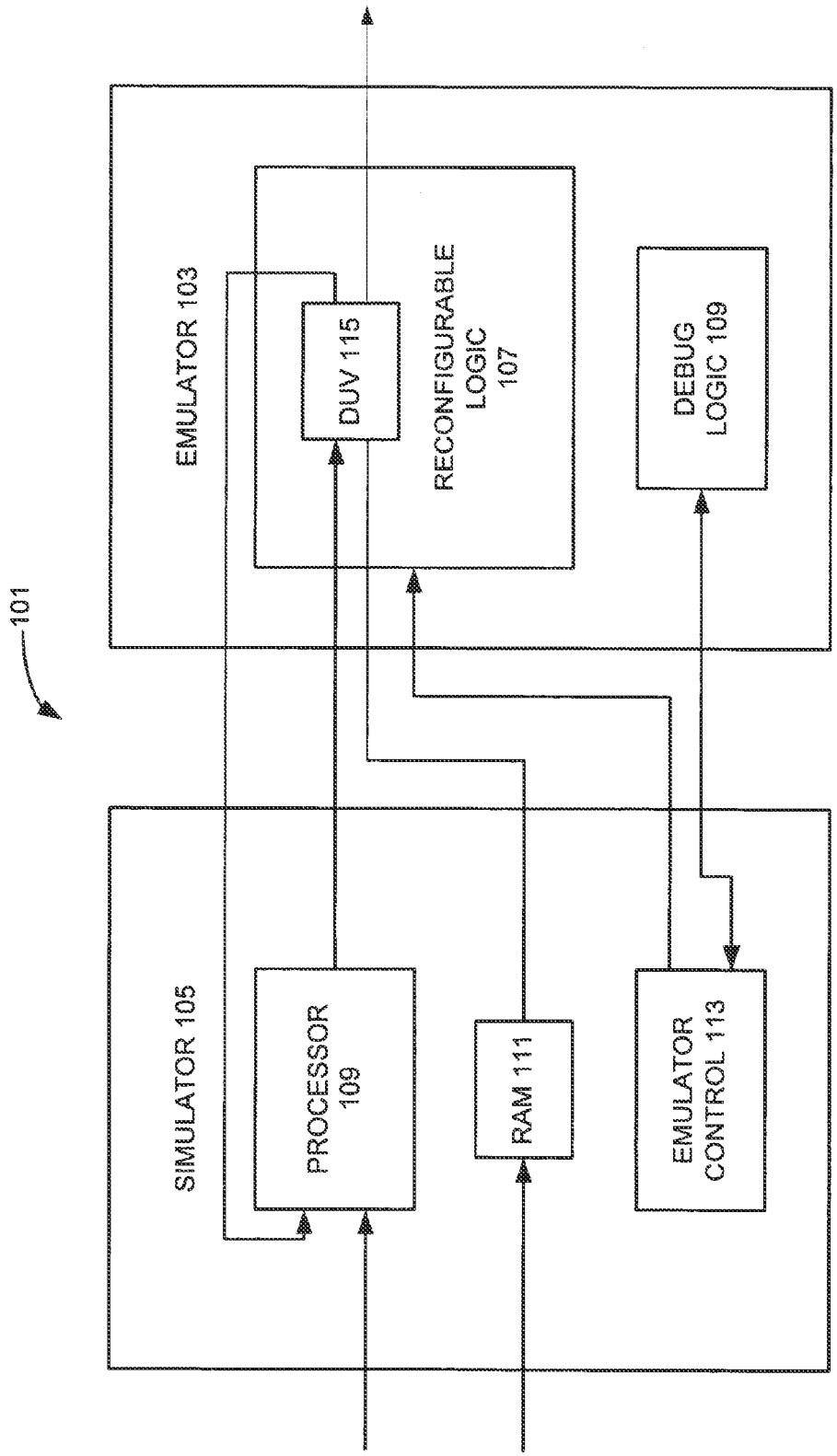
FIG. 1 illustrates a high level view of a system 101 for verifying a circuit design.

FIG. 1 illustrates a high level view of a system 101 for verifying a circuit design. The system 101 includes an emulator 103 and a simulator 105. The emulator 103 includes a group of reconfigurable logic devices 107, such as field programmable gate arrays (FPGA). The emulator 103 may also include one or more debugging logic devices 109, for debugging problems in the reconfigurable logic devices 107.

It should be appreciated that the system 101 can be employed to verify any desired type of circuit design. For example, various embodiments of the system 101 can be employed to test a design of an entire device, such as a microprocessor or integrated circuit memory. Some embodiments of the invention also may be employed to test a design for only a portion of a device, such as a register or other memory structure serving as a component in a larger device. Still further, various embodiments of the invention may be used to verify a circuit design that has been modified to incorporate testing structures for testing the manufactured device, such as scan chain structures.

The simulator 105 may include, for example, a programmable processor 109, such as a programmable microprocessor and a memory 111, which may be any type of suitable memory device, such as a read/write memory (RAM). As will be appreciated by those of ordinary skill in the art, the processor 109 and the memory 111 cooperate (together with other devices, as necessary) to execute a software program simulating the operation of one or more portions of a circuit. The simulator 105 may also include an emulator control 113, to facilitate downloading of information to the reconfigurable logic devices 107 (including, for example, information for defining the interconnections in the reconfigurable logic devices 107) and to facilitate debugging of reconfigurable logic devices 107 through the use of the debugging logic devices 109 in the emulator 103. As shown in FIG. 1, the emulator control 113 is implemented using a hardware device, but with still other embodiments of the invention the emulator control 113 may be implemented using software, or a combination of hardware and software as desired.

With the illustrated embodiment, at least a portion of the circuit design being verified is emulated by the emulator 103. Accordingly, some or all of the reconfigurable logic devices 107 are configured to emulate this portion of the circuit design. These reconfigured logic devices may be referred to as the "Device Under Verification" (DUV) 115, or, alternately, the "Device Under Test" (DUT). The simulator 105 then simulates other "supporting" electronic circuitry that may be used in conjunction with the circuit design being verified. This simulated circuitry may be a portion of the overall circuit design being verified, one or more external circuit structures required to operate the device being verified, or a combination of both. Also, the electronic circuitry simulated by the simulator 105 may be conventional, or it may also be of a new design to be verified. It should be appreciated, however, that with still other embodiments of the invention, the circuit design being verified may be simulated by the simulator 105, and the emulator 103 may instead be used to emulate various "supporting" circuitry components.

Communication Between the Emulator and the Simulator

Figure 2A:
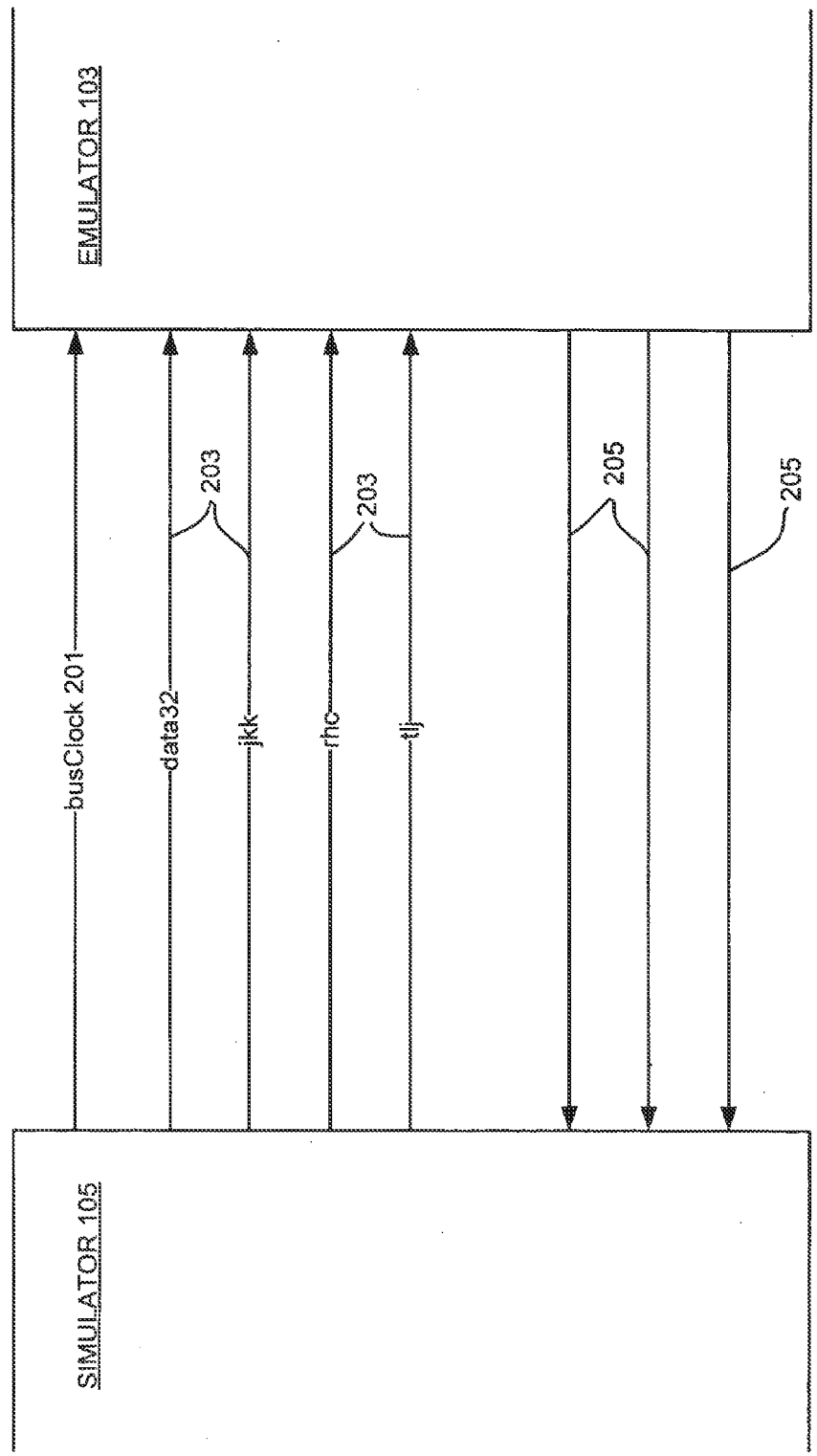
FIG. 2A shows data signals exchanged between and emulator and a simulator.

FIG. 2A illustrates an example of several representative communication signals that may be sent from the simulator 105 to the device under verification 115 according to various embodiments of the invention. The communication signals may include, for example, a clock signal (busClock) 201 and one or more data or command signals 203, such as signal data 32, signal jkk, signal rhc, and signal tlj. This figure also illustrates an example of representative communication signals 205 that may be sent from the device under verification 115 to the simulator 105. As will be discussed in more detail below, both signals 203 from the simulator 105 to the device under verification 115 and signals 205 from the device under verification 115 to the simulator 105 may be channelized according to various examples of the invention. A signal may consist of only a single bit of information, or a signal may include an entire data word made up of any desired number of bits, or even a combination of data words grouped together.

Figure 3:
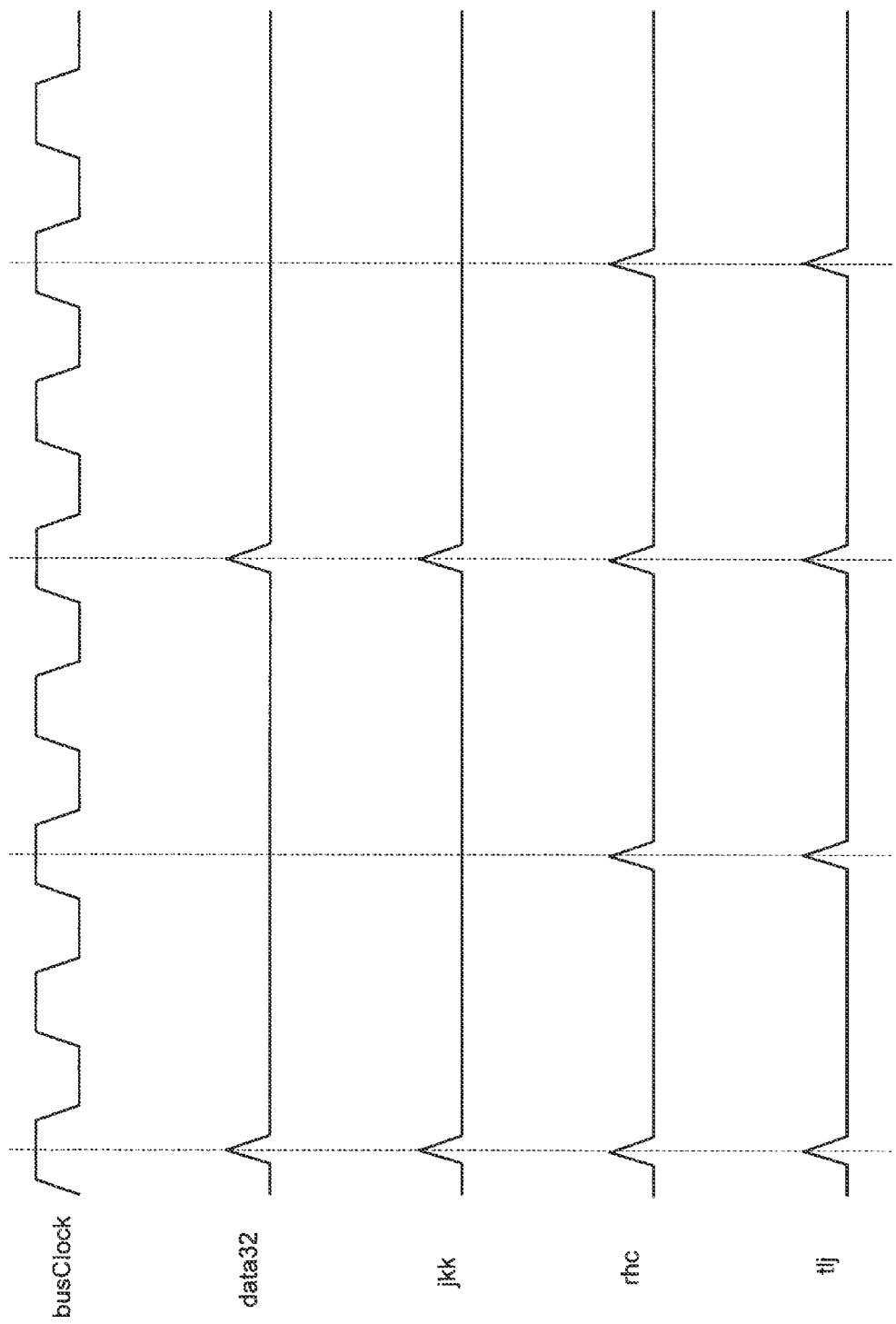
FIG. 3 illustrates a timing diagram for the data signals of FIG. 2A.

FIG. 3 shows a timing diagram for these communication signals illustrating the relative frequency at which the value of each signal 201 and 203 may change. As seen in this figure, the busClock signal is a clock signal with a 50% duty cycle.

The data 32 and jkk signals are multicycle signals, the value of each of which may change after the start of every fourth cycle of the busClock signal 201. The rhc and tlj signals are also multicycle signals, but these signals change after the start of every second cycle of the busClock signal 201. It should be noted that, while the signals 203 are illustrated in FIG. 3 as being capable of changing values at regular intervals, the actual value of any of the signals 203 may remain constant over any number of cycles (i.e., a signal value may be repeated for two or more consecutive cycles of the busClock signal 201).

With a conventional emulator and simulator arrangement, each of these signals might simultaneously be delivered along a dedicated communication pathway. According to various embodiments of the present invention, however, communication signals are grouped into channels based upon one or more common parameters. That is, instead of continuously providing values of all the signals, signals sharing one or more common parameters are grouped together and channelized, thereby enabling multiple signals to be sent on a single communication pathway. Moreover, the channel will be transmitted over the pathway only when necessary, freeing the pathway to carry other data when the channel is not being transmitted.

Figure 2B:
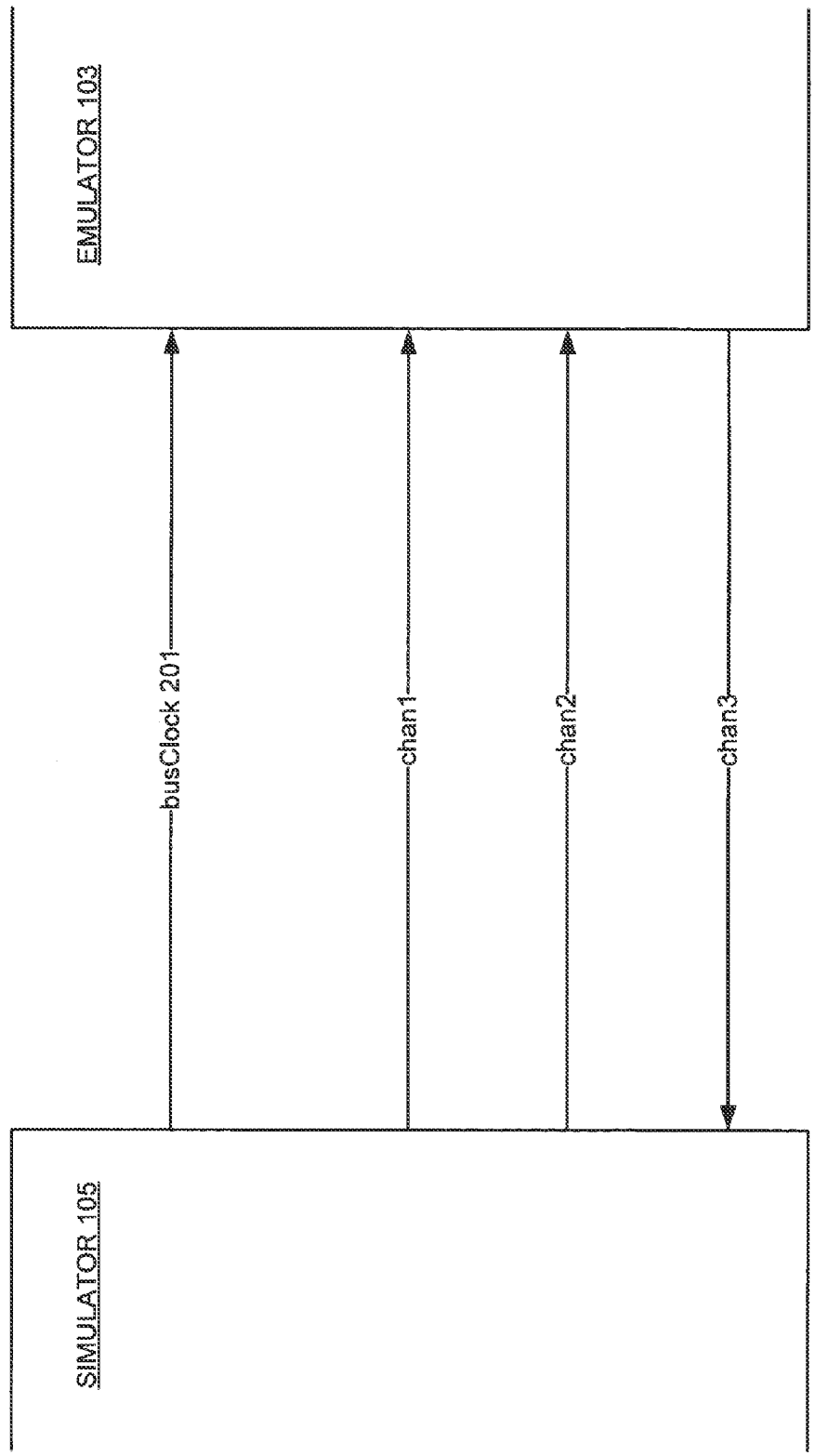
FIG. 2B illustrates the organization of the data signals of FIG. 2A into data channels according to various embodiments of the invention.

For example, according to various embodiments of the invention, with the sample communication signals shown in FIGS. 2A and 3, signals jkk and data 32 sharing a common change frequency and phase may be grouped together into a channel identified as chan 1. In a similar manner, communication signals rhc and tlj sharing another change frequency and phase may be grouped into another channel labeled chan 2 in FIG. 2B. Likewise, one or more of the signals 205 may be collected into a channel labeled chan 3 in FIG. 2B. When any signal that is part of a channel changes, the simulator 105 may send all of the signal values that are part of that channel across the interface to the emulator 103. However, according to various embodiments of the invention, only channels with changes in at least one of the channel signals have the values of their signals transmitted. Thus, if the values of both signal jkk and signal data 32 do not change during a period of time, then the channel containing those signals will not be transmitted during that period of time.

In addition to grouping communication signals according to one or more parameters, with some embodiments of the invention the circuit components employing the grouped signals are physically located proximal to each other. More particularly, when communication signals are grouped together into a channel, the circuit components that will employ those signals are identified as a corresponding component group. When the DUV 115 in the emulator 103 is configured, the portions of the emulator 103 that will emulate these circuit components are physically located near one another.

More particularly, the components that output signals to the simulator 105 sharing a single channel should be physically located near one another. By placing these components close to each other, any delay between selecting the various components to produce the signal can be minimized or avoided. Further, the output signals making up the channel can be more efficiently and quickly relayed from their associated emulated components to the output pin through which the channel is transmitted to the simulator 105. If the emulated components of a corresponding component group were randomly distributed across the DUV 115, relaying each signal in the channel would require time and resources to transmit the signal through unrelated portions of the emulator 103. Similarly, the components that receive signals from the simulator 105 over a single channel should be physically located near one another. By placing these components close to each other, the incoming signals making up the channel can be more efficiently and quickly relayed from the input pin through which they are received from the simulator 105 to their intended emulated components.

Still further, related components may be grouped together into clusters based upon, e.g., a related function. For example, a set of memory circuits may be employed together to form a memory register, such that each bit in the register will be updated or read at the same time. According to some aspects of the invention, those memory circuits making up the register will be placed proximal to each other in a cluster of memory circuits.

By grouping the emulated components of a corresponding component group together physically, the signals in the shared channel can be more efficiently and thus more quickly relayed to or from their associated emulated components. It should be appreciated, however, that various physical grouping techniques may be employed to physically locate the components of a corresponding component group close together. With some embodiments of the invention, the components may be placed as close together as permitted by emulation configuration parameters, design constraints, or any other existing constraints. With still other embodiments of the invention, however, the components of a corresponding component group may be considered physically close together if all of the components are located within a designated zone or region of the emulator 103. Still other criteria, such as component selection and/or signal timing criteria, may be employed to determine how the components of a corresponding component group are physically arranged so as to be located close together.

By grouping the communication signals according to one or more shared parameters, dedicated communication pathways are not required for all input signals to the DUV 115 in the emulator 103. As previously noted, in conventional schemes, each input to the DUV 115 in the emulator 103 is typically provided a dedicated pathway that is constantly driven and connected directly to the appropriate input logic of the DUV. According to various examples of the present invention, however, these signals are grouped together, thus reducing pathway usage, a valuable asset with today's circuit designs.

In addition, as noted earlier, devices according to various embodiments of the invention may only communicate signal values when there is a change on a signal that is part of a channel. By only transmitting the signals of a channel when there is activity on one of the constituent signals of the channel, the rate and amount of data exchange between the simulator 105 and the emulator 103 is further reduced. Still further, according to various examples of the invention, depending upon the number of signals in a channel, the duration of each signal value and the frequency of change for a channel, it may be possible to share a single communication pathway among two or more channels. Thus, it will be appreciated that each channel is independently controlled, i.e., the transmission of signals for each channel is separately managed. This separate control may be implemented using, for example, software controls.

Figure 4:
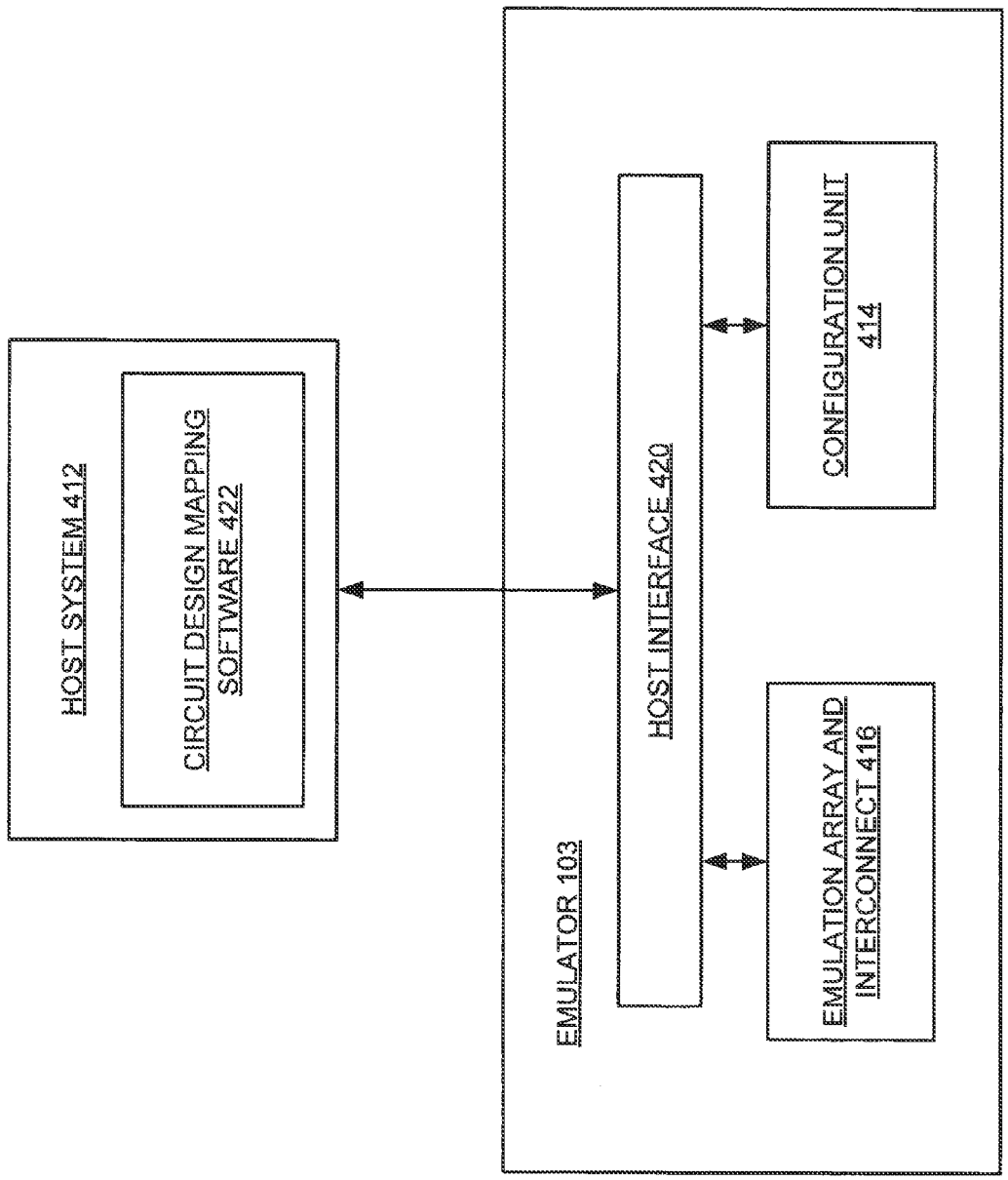
FIG. 4 shows an interface between an emulator and a simulator according to various embodiments of the invention.

FIG. 4 shows an example of an interface between a host system 412 and an emulator 103. In this arrangement, the host system 412 contains circuit design mapping software 422 for translating a design to a form that the emulator 103 can properly emulate when it is presented to the emulator 103 through the host interface 420. The emulator 103 then includes the host interface 420 for receiving the translated design information from the circuit design mapping software 422, a configuration unit 414 for configuring the emulation array and interconnects 416 (or other configurable logical devices) implementing the emulator 103. As discussed in detail above, with the various examples of the present invention, the circuit design mapping software 422 generates circuit design mappings such that the emulated components corresponding to signals grouped together into a common channel are physically proximal to one another.

Figure 5:
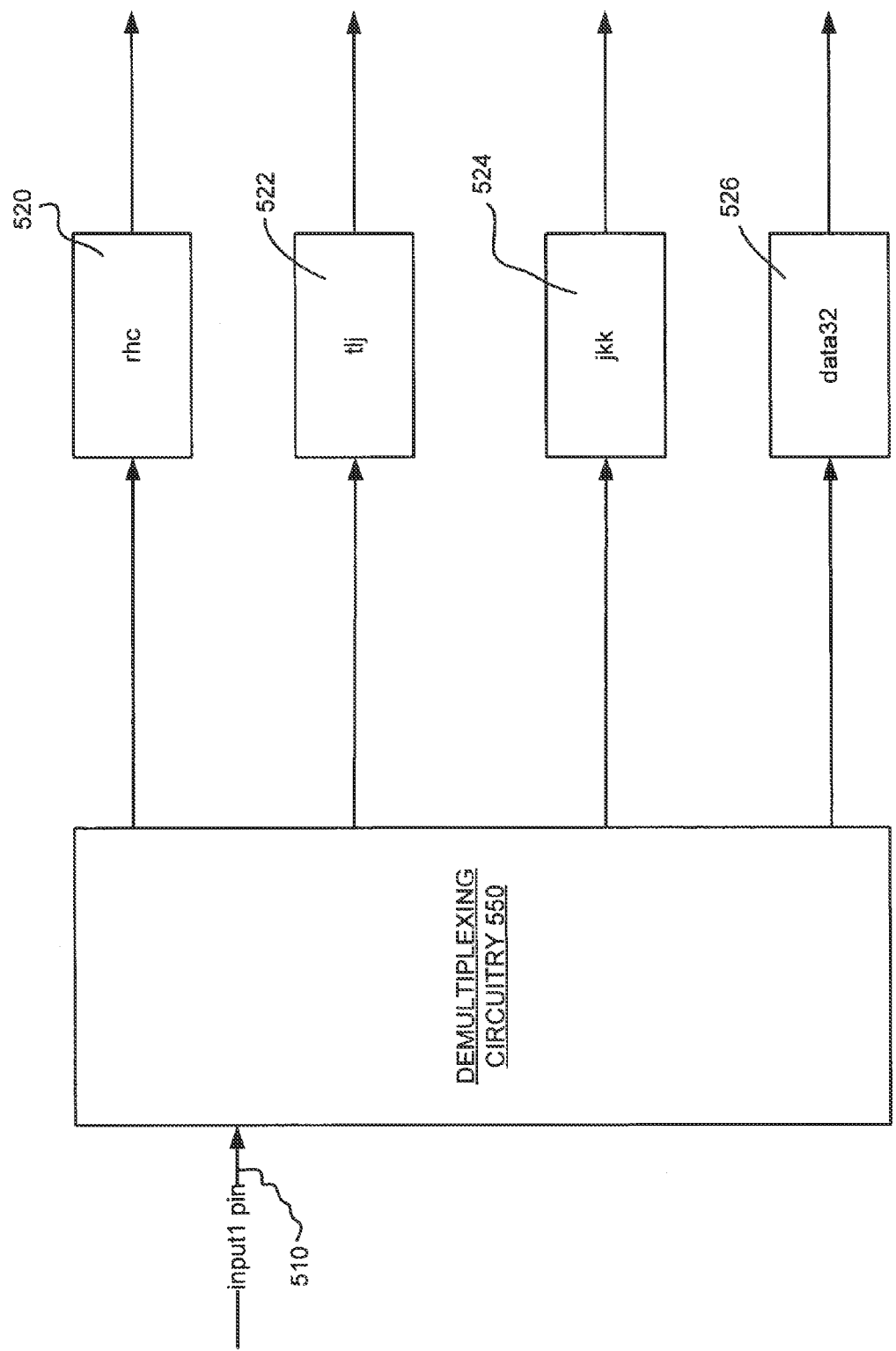
FIG. 5 shows an arrangement for demultiplexing data signals of FIG. 2A from a common data channel according to various embodiments of the invention.

In addition to performing its conventional functions, the circuit design mapping software 422 may also modify the emulated design to include multiplexing or de-multiplexing circuitry. FIG. 5 shows a block diagram of an example of the type of de-multiplexing circuitry that may be included in the emulation of a circuit design according to various embodiments of the invention. This de-multiplexing circuitry 550 is mapped to the reconfigurable logic of the emulator 103 as part of the original design information transferred to the emulator 103 via the host interface 420. This figure also illustrates a communication pathway 510 from a simulator 105 to an emulator 103, labeled input1_pin. As previously discussed, in various embodiments of the invention a physical pathway between the simulator 105 and the emulator 103 may carry two or more channels. In the illustrated embodiment, the pathway input1_pin is shown carrying the two channels chan2 and chan1. As also previously noted, in this example each of these two channels are themselves a composite of two signals. The de-multiplexing circuitry 550 thus will de-multiplex the composite signal arriving on input1_pin, and derive the proper signal values for the four multiplexed design input pins 520-526. Similarly, when output signals from the emulator 103 are to be grouped together into a channel, the emulator 103 may be configured to include a multiplexer for joining the output signals into the channel.

As previously noted, various embodiments of the invention may group signals together into a channel based upon a common change frequency or phase. Determining the frequency of change for the input signals can be performed by various embodiments in numerous ways. With some embodiments of the invention, for example, the components producing the signals that drive the inputs to the DUV 115 can be simulated. With these embodiments, the output signals 203 of the simulator 105 can be sampled during the simulation, to determine the frequency of change of each of these signals. This information can then be used to organize the signals into one or more channel groups. Similarly, the components that produce the signals to be output from the DUV 115 can be simulated, and the sampled simulation information used to organize these signals into one or more channel groups.

In still other embodiments of the invention, instead of simulating the output values of components in the simulator 105 or emulator 103, the user may provide detailed information about the frequency of change of each signal to the emulated design via a configuration file. The configuration file is then read by the host system 412 and the associated circuitry for creating the channels (e.g., multiplexing or de-multiplexing circuits) are created in the emulator 103 as detailed in the configuration file.

Values of certain signals within a design may only be relevant to the design at particular times. For example, communication between a simulator 105 and an emulator 103 can involve both synchronous and asynchronous signals. Signals which are asynchronous may affect a design in a manner unrelated to any clock signals, so the value of these signals may potentially be relevant at all times. As a result, whenever a transition occurs on such a signal, it is significant and should be transmitted to the appropriate verification component. The value of these asynchronous signals at other times may not be relevant.

One method of reducing the communication between a simulator 105 and an emulator 103 in a co-verification environment according to various embodiments of the invention is to recognize signals having values that are not relevant except at particular times or upon the occurrence of particular events. Transmission of the values of those identified signals between the simulator and the emulator can then be deferred until a relevant time or event occurs.

Figures 6, 7:
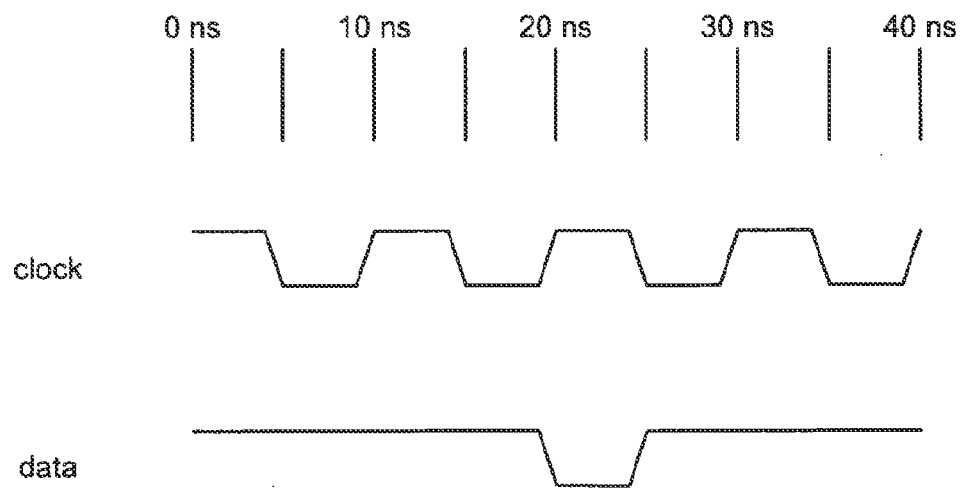
FIG. 6 illustrates an example configuration file that may be employed according to various embodiments of the present invention.
FIG. 7 illustrates an example of a communication signal having a value that does not change over a period of time.

The determination of the signals whose transmission value may be deferred until the occurrence of a later time or event may be determined in various ways. According to some embodiments of the invention, a user can specify a signal and an appropriate time or event for its transmission in a configuration file. FIG. 6 illustrates an example of such a configuration file according to one embodiment of the present invention. The configuration file contains signal change events (that is, the names of the signal or signals that are to be synchronized to time or events). As illustrated in this example, the data bus, data[31:0], is to be synchronized to every second rising edge of the signal sysclock. Thus, with this example, any transitions that would occur on the output of any signal on data[31:0] will not be transmitted. However, at every second rising edge of sysclock, if any transitions had occurred on the data bus, then the current value of all data bus signals will be transmitted.

FIG. 6 also illustrates the ability to have signals values deferred and sent at specific times. As shown in this figure, the configuration file specifies that the value of signal qtz is sent at a specified system time event, specifically every 40 ns. Consequently, any transitions on the qtz signal outside of this time event will not be sent to the emulator. Every 40 ns, a determination will be made, and if there were any transitions on qtz since the previous evaluation, then the value of qtz will be sent to the emulator 103 at that time.

Referring back to FIG. 4, circuit design mapping software 422 will operate to process the aforementioned configuration files in the previously discussed examples. Upon reading a configuration file while processing the design for use in the emulator 103, the circuit design mapping software 422 will analyze the signals with value transition events that are to be deferred, as indicated by the configuration file, and from this analysis determine a suitable interface configuration between a simulator and the emulator to reduce communication resource usage by the deferred signals.

In other embodiments of the invention, signal transmission timing information may be empirically derived from the design to be simulated. For example, by analyzing a design to be emulated, a determination may be made as to the sensitivity of the design to signal value transitions at specific times or event. In still other embodiments of the invention, information about the behavior of output signals of the simulator 105 (e.g. inputs to the design to be emulated) may be used to determine configuration information for deferring input signal events to a device to be emulated.

As previously discussed, communication of input and output (I/O) signals to a design under verification (DUV) 115 can constitute a significant portion of the bandwidth in communications between the simulator and emulator. Thus, efforts to minimize the I/O communication in the process of emulating a design can bring about a reduction in the overall communication bandwidth requirement for input/output data. Such a reduction provides the ability to add additional services, such as added trace functionality, for a fixed amount of communication bandwidth.

In still other embodiments of the invention, signals may be evaluated on a per signal basis and only those signals with changed values will be transmitted. More particularly, as previously noted, a channel's use of a communication pathway can be minimized by transmitting the communication signals of the channel only when the value of one or more signals within the channel changes. For example, while inputs to a design can be synchronized to be sent only at certain times or events, such as at clock edges, it may be that, even at the appropriate time to send the value of an input signal to a design, the input value (along with any other signal values of its channel) has not changed from its previous value. In such a case, it would desirable to not send the value and therefore not use the communication bandwidth required to send the channel with unchanged signal values.

FIG. 7 shows an example of such a communication signal. In this example, the signal clock is a 100 MHz clock signal, while the signal data is a synchronous signal that is registered on the rising edge of the signal clock. Rising edges of the signal clock are shown at 10 ns, 20 ns and 30 ns. Thus, the values of data would normally be transmitted at these edges. In this illustrated example, however, if the value of data is sent at t=10 ns, there is no need to send the value of data at either 20 ns or 30 ns, as the value of the signal data does not change at these times. More particularly, at 20 ns, there has been no transition of the signal value since the signal was transmitted at t=10 ns, so there is no need to retransmit the signal's current value. At 30 ns, there still is no need to transmit the value of this signal. While there has been a transition of the signal's value, the value of the signal at 30 ns is the same when the value of the signal was previously transmitted. Thus, there is no need to send the signal data from the simulator 105 to the emulator 103 at t=30 ns.

Figure 8:
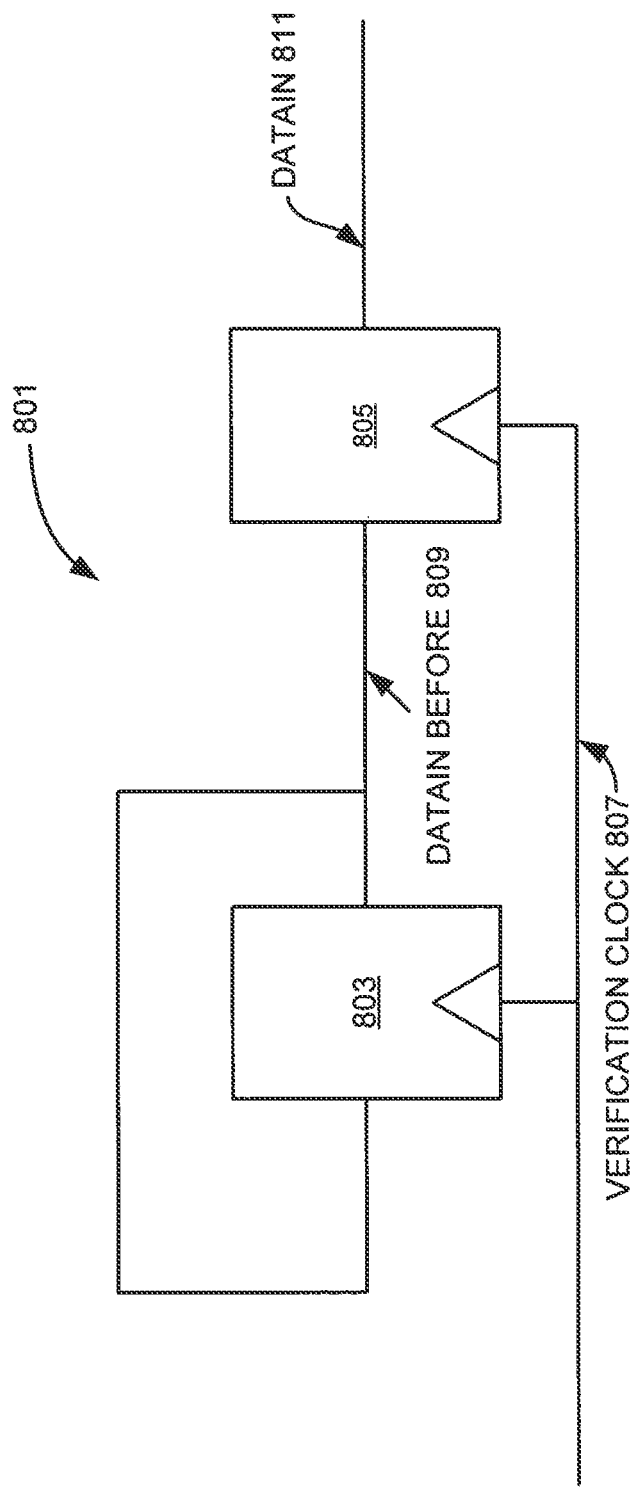
FIG. 8 illustrates circuitry that may be added to an emulated design according to various embodiments of the invention to persistently and accurately store the value of a signal from the simulator until the signal's value changes.

To facilitate emulation where the channels are only sent when there is a change to the output signal, several architectures may be employed. As will be appreciated by those of ordinary skill in the art, there are numerous methods of performing this task. In various embodiments of the invention, for example, the design to be emulated is modified by the circuit design mapping software 422 to include extra circuitry to persistently and accurately store values of the communication signals from the simulator 105. More particularly, the design mapping software 422 may have the emulator 103 emulate a structure that persistently and accurately stores the value of a signal from the simulator 105 until the signal's value changes. As with the previously-described examples of the invention, however, the outputs are grouped by channel. Further, the output signals making up the channel are sent only when there is a change to one of the signals FIG. 8 shows one example of circuitry that may be added to an emulated design according to various embodiments of the invention. The modification of the design may be performed, e.g., by the circuit design mapping software 422 in a manner similar to that described above with respect to channeling of the communication signals. As seen in this figure, the circuit 801 includes two D-type flip flops 803 805, a verification clock signal 807, a datain before signal 809 and a datain signal 811. With this embodiment, the signal datain 811 is an interface signal of the design. A new value for the datain signal 811 first is written on the datain before signal 809. A rising edge of the verification clock signal 807 will propagate the value of the datain before signal 809 to the datain signal 811. Further, the value of the datain before signal 809 is memorized by the first D-type flip flop 803, and will not be written to the datain signal 811 if the value does not change.

In the above described embodiments, signals are organized into channels based upon timing characteristics shared by the signals. It should be appreciated, however, that any desired parameter or set of parameters can be used to arrange one or more signals into a channel. For example, various embodiments of the invention may alternately or additionally organize signals into a logical channel based upon the location at which they are received or sent from the emulator. Thus, two or more signals being transmitted to a specific portion of the emulator 103, such as an emulated memory device, may be organized into a channel. The signals in this channel may then be transmitted only when the associated portion of the emulator should receive the signals. Still further, signals that originate from a specific portion of the emulator may be collected into a single logical channel. For example, two or more of the signals from an emulated memory device may be grouped together and transmitted over the same logical channel.

Figure 9:
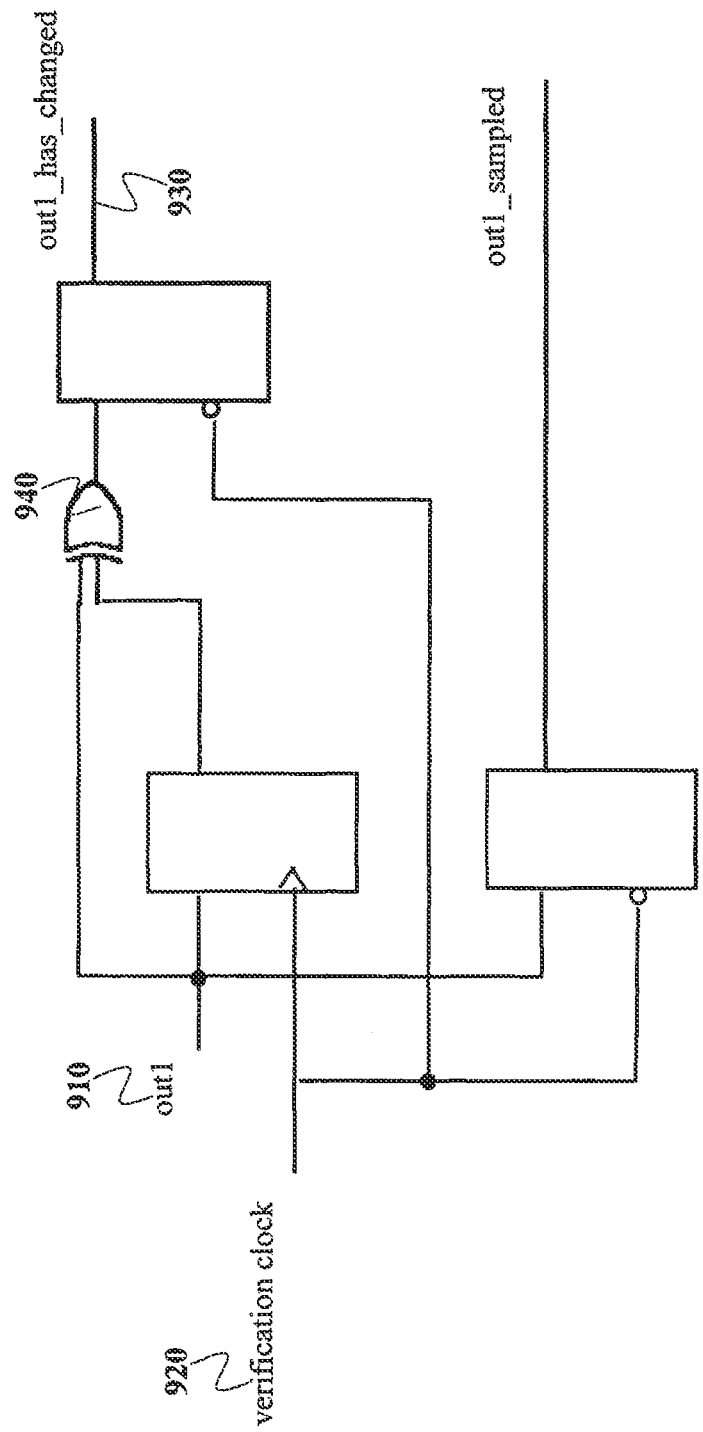
FIGS. 9 and 10 illustrate circuitry that may be added to an emulated design according to various embodiments of the present invention to persistently and accurately store the value of a signal from the emulator until the signal's value changes.
Figure 10:
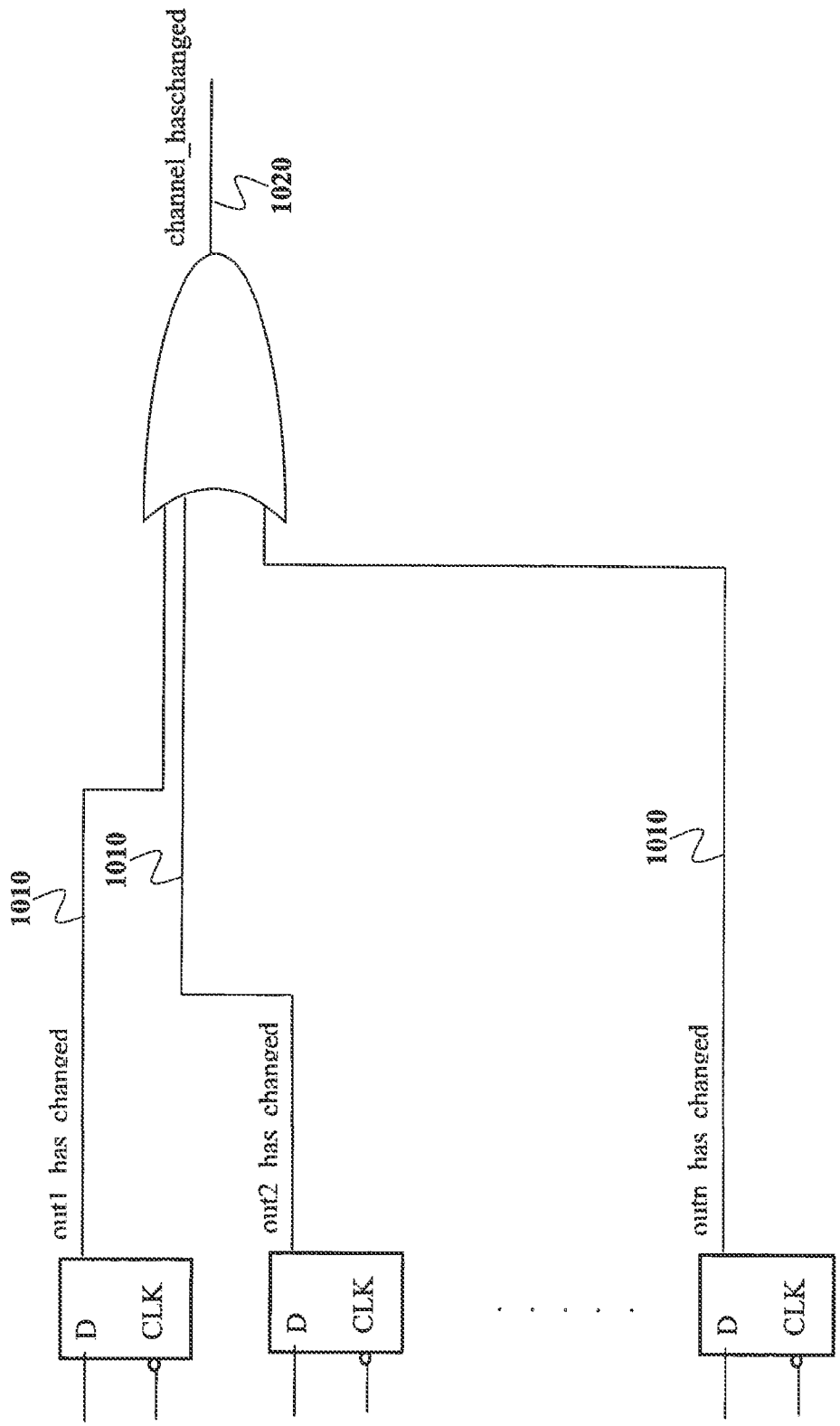

Similarly, the values of channels from the emulator 103 to the simulator 105 may be transmitted only upon a value transition. FIGS. 9 and 10 illustrate circuitry that may be added to an emulated design according to various embodiments of the present invention to persistently and accurately store the value of a signal from the emulator 103 until the signal's value changes. Disregarding potential issues with skew on the verification_clock line, XOR gate 940 is used to determine when a different value on out1 910 exists on a rising edge of the verification clock line 920 relative to the previous rising edge of the verification clock line 920. When such a difference occurs, for one-half of a clock period, out1_haschanged 930 will be asserted. FIG. 10 shows haschanged 1010 signals to show when one of the values on a single channel has changed. In this embodiment, a signal corresponding to the entire channel, channel_haschanged, 1020 is used to identify when one or more of the signals in a channel has changed. When this signal is asserted, the emulator 103 will then determine which signals have changed and send the changed values to the simulator 105. With various examples of the invention, there will be one channel_haschanged signal 1020 per channel to detect activity on each channel independently.

Still further, signals intended to perform a common operation can grouped into a signal channel on that basis of that functionality. For example, a "WRITE" operation to write data to a device may employ one or more data signals and one or more command signals (such as a "WRITE" command signal) to complete a "WRITE" operation. Two or more of these data and command signals may then be collected into a single logical channel that is transmitted only when both the values of the data signals change and the values of the command signals would allow the "WRITE" operation to be executed. Of course, still other parameters for organizing communication signals into logical channels will be apparent to those of ordinary skill in the art based upon the foregoing and following description.

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims.

We claim:

1. A method comprising:

determining, by a computing device, a signal change parameter for each of one or more signals of a design that is to be verified using an emulator and a simulator, said determining resulting in one or more determined signal change parameters;

assigning, based at least in part on common values of the one or more determined signal change parameters, the one or more signals into one or more channels of communication between first circuitry of the design that is to be implemented in the emulator and second circuitry of the design that is to be implemented in the simulator; and configuring the emulator in accordance with the one or more channels of communication.

2. The method of claim 1 wherein the one or more determined signal change parameters includes a frequency of change parameter for each of the one or more signals, and wherein upon said assigning the one more signals into the one or more channels of communication, a first channel of the one or more channels of communication includes signals that have equal frequency of change parameter values.

3. The method of claim 1 further comprising:
generating a circuit design mapping that includes an emulation circuit component grouping for a first channel of the one or more channels of communication, wherein the emulation circuit component grouping includes circuit components for each signal assigned to the first channel.

4. The method of claim 1 further comprising: configuring the emulator such that a physical connection between the emulator and simulator provides the one or more channels of communication between the emulator and the simulator.

5. The method of claim 2 wherein said determining is performed by reading a configuration file.

6. The method of claim 2 wherein said determining is based on results from a simulation of at least part of the design.

7. The method of claim 1 further comprising:
identifying one or more components of the design that are associated with a channel of the one or more channels of communication; and
wherein configuring the emulator includes physically locating the one or more components within the emulator as an emulation circuit component grouping.

8. A method comprising:
detecting a transition of an input or output signal in circuitry of a design that is being modeled in an emulator and a simulator;
determining which channel of communication between first circuitry of the design that is modeled in the emulator and second circuitry of the design that is modeled in the simulator the input or output signal is assigned, resulting in a determined channel between the first circuitry and the second circuitry that represents a grouping of signals that share a common value of a signal change parameter; and
transmitting one or more values of the determined channel using at least a physical interface signal of the emulator.

9. The method of claim 8 wherein transmitting the one or more values of the determined channel is conditioned upon occurrence of a clock edge.

10. The method of claim 8 wherein the one or more values of the determined channel include one or more other modeled input and output signals of the design.

11. The method of claim 8, wherein the transmitting occurs at a deferred time subsequent to the detecting of the transition.

12. The method of claim 8, further comprising modeling the design in a co-verification system that includes the emulator and the simulator.

13. The method of claim 8, wherein the signal change parameter is a frequency of change parameter.

14. A method comprising:
organizing a plurality of signals of a design that is being modeled in a co-verification system into a plurality of logical channels at least in part by signal change parameter values of the plurality of signals;
mapping each logical channel to physical signals between first circuitry of the design being modeled in a simulator of the co-verification system and second circuitry of the design being modeled in an emulator of the co-verification system, wherein a particular logical channel includes one or more member signals that have a common value of a signal change parameter, and
transmitting one or more values of the one or more member signals on at least a portion of the physical signals between the simulator and emulator.

15. The method of claim 14, wherein organizing the plurality of signals into the plurality of logical channels is further based on reducing communication between the first circuitry of the design being modeled in the simulator and the second circuitry of the design being modeled in the emulator by grouping, into each logical channel of the plurality of logical channels, only modeled signals with equal signal change parameter values.

16. The method of claim 14 wherein mapping comprises:
connecting the one or more member signals onto at least the portion of the physical signals; and
disconnecting one or more modeled signals from the physical signals, wherein the one or more modeled signals are members of one or more channels that are not associated with any occurring events.

17. The method of claim 14 further comprising:
determining that transitions of the one or more member signals have occurred, resulting in one or more transitioned member signals,
wherein the transmitting includes sending only values of the one or more transitioned member signals.

18. The method of claim 14 wherein transmitting the one or more values of the one or more member signals is conditioned upon occurrence of a clock edge.

19. The method of claim 14, further comprising:
detecting occurrence of an event associated with the particular logical channel, wherein transmitting the one or more values of the one or more member signals is in response to the detecting.

20. The method of claim 14, wherein the signal change parameter is a frequency of change parameter.

* * * * *